(12) United States Patent
Claxton

(10) Patent No.: US 6,178,388 B1
(45) Date of Patent: Jan. 23, 2001

(54) METHOD AND APPARATUS FOR CALIBRATING A RESISTIVE LADDER SWITCHING MATRIX

(75) Inventor: Daniel D. Claxton, Rancho Santa Fe, CA (US)

(73) Assignee: Qualcomm Incorporated, San Diego, CA (US)

(*) Notice: Under 35 U.S.C. 154(b), the term of this patent shall be extended for 0 days.

(21) Appl. No.: 09/191,200

(22) Filed: Nov. 13, 1998

(51) Int. Cl.[7] .................... H03K 17/94; H03M 11/00
(52) U.S. Cl. .................................. 702/107; 341/22
(58) Field of Search ...................... 702/107, 85; 341/22, 341/34

(56) References Cited

U.S. PATENT DOCUMENTS

| | | | | |
|---|---|---|---|---|
| 4,015,254 | * | 3/1977 | Strandt | 340/365 S |
| 4,118,700 | * | 10/1978 | Lenihan | 340/524 |
| 4,695,840 | * | 9/1987 | Darilek | 340/825.054 |
| 4,884,070 | * | 11/1989 | Hannaford | 340/825.78 |
| 5,469,364 | * | 11/1995 | Hughey et al. | 364/482 |
| 5,510,783 | * | 4/1996 | Findlater et al. | 341/34 |
| 5,515,040 | * | 5/1996 | Lee et al. | 340/870.04 |
| 5,543,588 | * | 8/1996 | Bisset et al. | 178/18 |
| 5,619,196 | * | 4/1997 | Escobosa | 341/22 |
| 5,798,716 | * | 8/1998 | Davis | 341/26 |
| 5,900,829 | * | 5/1999 | Gardner et al. | 341/26 |
| 5,929,790 | * | 7/1999 | Lim | 341/22 |

* cited by examiner

Primary Examiner—Patrick Assouad
(74) Attorney, Agent, or Firm—Philip Wadsworth; Charles D. Brown

(57) ABSTRACT

A method and apparatus for calibrating a resistive ladder switching matrix coupled to a keypad in a portable electronic device having a housing with a cover that may be positioned in an open state or a closed state. A first contact of a calibration element is coupled to a reference voltage and a second contact of the calibration element is coupled to ground by moving the cover from the open state to the closed state. When the first contact of the calibration element is coupled to the reference voltage and the second contact of the calibration element is coupled to ground, a calibration resistance across the calibration element is determined. The calibration resistance may correspond to an input impedance of the resistive ladder switching matrix when no buttons associated with the keypad are depressed. Signals from the resistive ladder switching network are calibrated when the cover is in the closed state in accordance with the calibration resistance.

24 Claims, 1 Drawing Sheet

METHOD AND APPARATUS FOR CALIBRATING A RESISTIVE LADDER SWITCHING MATRIX

BACKGROUND OF THE INVENTION

I. Field of the Invention

The present invention relates generally to resistive ladder switching matrices. More particularly, the present invention relates to resistive ladder switching matrices used for operating keypads in portable electronic devices such as, for example, mobile telephones. Even more particularly, the present invention relates to a method and apparatus for calibrating resistive ladder switching matrices so as to compensate for variations in operating parameters such as temperature and oxidation on the keypad contacts connecting the keypad resistive ladder to the processing circuitry in the portable electronic device.

II. Description of the Related Art

Resistive ladder switching matrices (or networks) are well known in the art, and are typically used for operating keypads in electronic devices. In such systems, depression of a button on the keypad completes the electrical connection of one or more resistors between a reference voltage and ground such that a unique voltage is produced at the output of the matrices in response to the depression of each button on the keypad. By monitoring the amplitudes of the voltage signals output by the ladder network, a microprocessor can determine which button a user has depressed on the keypad.

Since the amplitudes of the output signals output by a ladder network are used to differentiate between depression of different buttons on the keypad, it is important that the network be properly calibrated so that the microprocessor can properly associate each voltage output from the network with the correct button on the keypad. Unfortunately, changes in temperature and oxidation on the contacts of the resistive ladder network will cause the voltage output in response to depression of each individual button to shift. Unless corrections are otherwise made to compensate for these voltage shifts, the microprocessor will be unable to correctly determine which button a user has depressed. Thus, it would be desirable to have system that could be used to calibrate the ladder network so as to account for such voltage shifts and insure that the microprocessor correctly associates each output voltage from the ladder network with the appropriate button on the keypad.

Electronic devices such as certain cellular telephones (known as 'flip-phones') and laptop computers have moveable covers that are opened and closed. In the case of flip-phones, the keypad used with the resistive ladder network may itself be positioned on the moveable cover such that keypad will be exposed and active when the cover is closed and "hidden" and inactive when the cover is in its open position. It would be particularly desirable if there were a system that could be used for calibrating resistive ladder networks which was adaptable for use with electronic devices such as flip-phones and laptop computers having moveable covers.

These problems and deficiencies are recognized and solved by the present invention in the manner described below.

SUMMARY OF THE INVENTION

The present invention is directed to a method and apparatus for calibrating a resistive ladder switching matrix coupled to a keypad in a portable electronic device having a housing with a cover that may be positioned in an open state or a closed state. A first contact of a calibration element is coupled to a reference voltage and a second contact of the calibration element is coupled to ground by moving the cover from the open state to the closed state. When the first contact of the calibration element is coupled to the reference voltage and the second contact of the calibration element is coupled to ground, a calibration resistance across the calibration element is determined. The calibration resistance corresponds to an input impedance of the resistive ladder switching matrix when no buttons associated with the keypad are depressed. Signals from the resistive ladder switching network are calibrated when the cover is in the closed state in accordance with the calibration resistance.

BRIEF DESCRIPTION OF THE DRAWINGS

The features, objects and advantages of the present invention will become more apparent from the detailed description set forth below when taken in conjunction with the drawings in which like reference characters identify corresponding elements throughout and wherein.

DETAILED DESCRIPTION OF THE PREFERRED EMBODIMENTS

Figure 1:
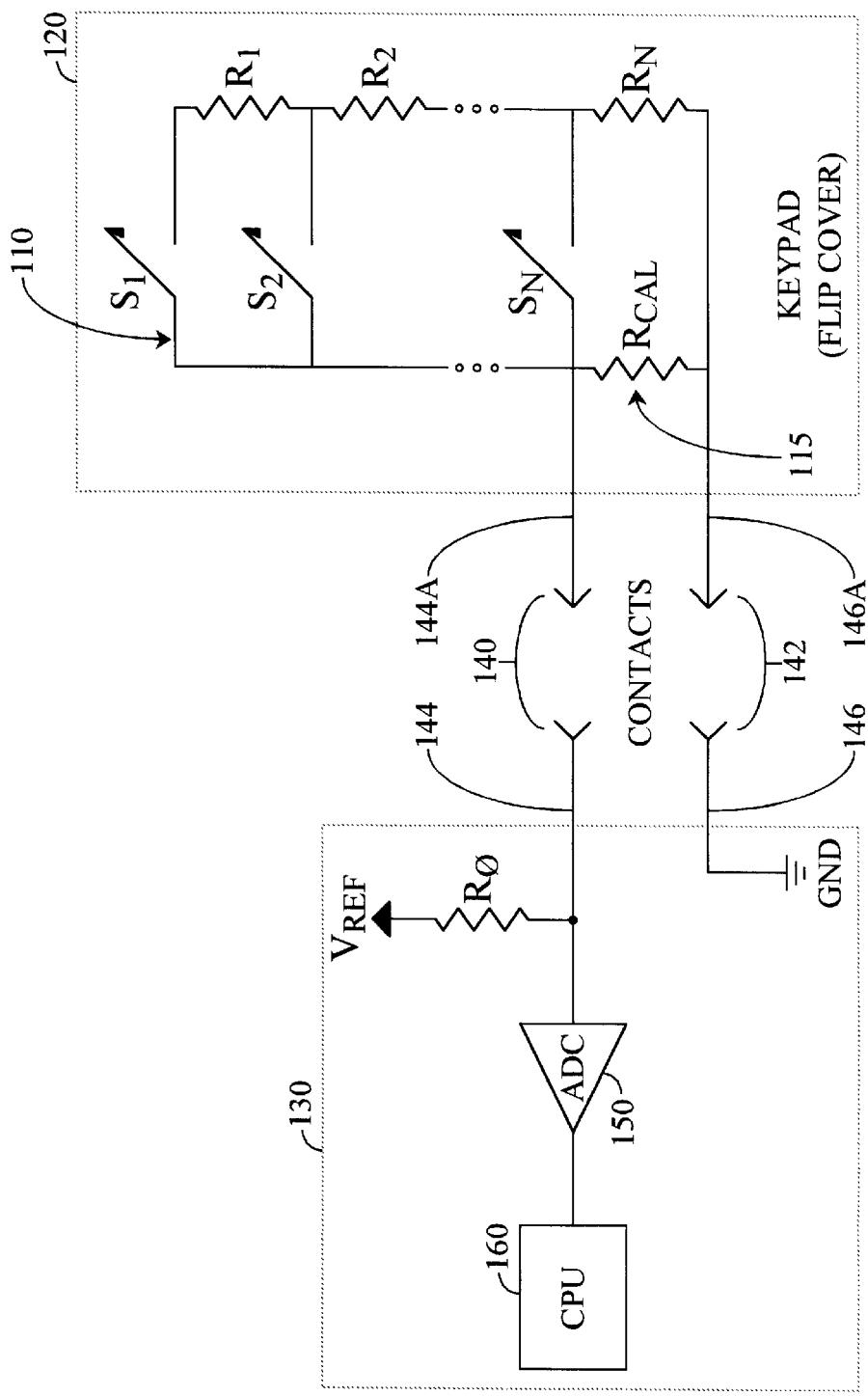
FIG. 1 is a block diagram showing a system for calibrating a resistive ladder switching matrix in accordance with the present invention.

Referring now to FIG. 1, there is a block diagram showing a system 100 for calibrating a resistive ladder switching matrix 110 in accordance with the present invention. In the embodiment shown in FIG. 1, the present invention is used for calibrating a switching matrix disposed upon cover 120 of a mobile cellular flip phone, although it will be understood by those skilled in the art that the present invention could be employed in connection with other electronic devices such as laptop computers that also use moveable covers which open and close. Moveable cover 120 preferably includes a keypad and is pivotally coupled to the base 130 of the flip-phone by a mechanical hinge (not shown). The mechanical hinge permits the cover 120 to pivot or rotate between an open position and a closed position. The keypad is preferably positioned on the exterior of the cover 120 such that the keypad is exposed to a user and active when the cover is in the closed state and contacts 140 and 142 are closed.

Electrical contacts 140 and 142 are coupled to terminals 144, 144a, 146 and 146a on the moveable cover 120 and base 130, and the relative position of contacts 140 and 142 varies as the moveable cover 120 pivots with respect to the base 130. In particular, when the moveable cover is positioned in its closed position, both of the contacts 140 are electrically joined together and both of the contacts 142 are electrically joined together. Conversely, when the moveable cover is in its open position, both of the contacts 140 are electrically separated from each other, and both of the contacts 142 are separated from each other. Thus, contacts 140 function to electrically couple terminal 144 to terminal 144a when the moveable cover 120 is moved into its closed position, and contacts 142 function to electrically coupled terminal 146 to terminal 146a when the moveable cover 120 is moved into its closed position. When the moveable cover 120 is rotated to its open position, contacts 140 are separated and contacts 142 are separated, thereby resulting in the disconnection of terminal 144 from terminal 144a, and the disconnection of terminal 146 from terminal 146a.

The switches $S_1, S_2 \ldots S_N$ in the ladder matrix 110 are coupled to and actuated by the buttons (not shown) on the phone keypad located on cover 120. When the moveable cover 120 is in the closed position, one or more of the resistors $R_1$, $R_2$ ... $R_N$ in the ladder matrix will be selectively coupled to the reference voltage through ground upon depression of one of the switches $S_1$, $S_2$ ... $S_N$. Thus, when the cover 120 is in the closed position, depression of one of the buttons on the keypad will cause a unique voltage associated with the depressed button to be provided to analog-to-digital converter 150, and then to microprocessor 160. Based on the amplitude of the voltage signal supplied to the microprocessor 160, the microprocessor then identifies the button that has, been depressed on the keypad. As mentioned in the background, the amplitude of these voltage signals will vary as a result of temperature changes and oxidation on the contacts 140 and 142.

The present invention further includes a calibration element 115 which, as shown in FIG. 1, can be modeled as a resistor ($R_{CAL}$) that will have one terminal connected to the reference voltage and one terminal connected to ground when the cover 120 is in its closed position. In a preferred embodiment, the calibration element does not correspond to a physical resistor as shown in FIG. 1, but instead simply represents a resistance that corresponds to the input impedance of the resistive ladder switching matrix 110 when no buttons associated with the keypad are depressed. In alternate embodiments, the calibration element 115 can also include a physical resistor and, in such cases, the total resistance of the calibration element 115 will be equal to the resistance of the physical resistor plus a resistance that corresponds to the input impedance of the resistive ladder switching matrix 110 when no buttons associated with the keypad are depressed. When the cover 120 is in its open position and none of the switches S1, S2 or S3 are actuated, the calibration element 115 supplies a voltage to the analog-to-digital converter 150, and finally to microprocessor 160. By measuring the voltage supplied to the ADC 150, the microprocessor 160 determines a calibration resistance that corresponds to the resistance of calibration element 115. As explained more fully below, changes in this calibration resistance can be used to track variations that appear in the ladder network over time as a result of temperature changes and oxidation of the contacts 140 and 142. Since the terminals of the calibration element 115 are connected to the reference voltage and ground through contacts 140 and 142, respectively, the terminals of the calibration element 115 will be disconnected from the reference voltage and ground when the cover is in its open position.

In a preferred embodiment, when contacts 140 and 142 are new and clean (e.g., when the phone or portable device in which the ladder switching matrix is disposed is new), the calibration resistance is initially measured and stored for reference ("the reference resistance"). At a later time, after perhaps contacts 140 and 142 have become worn, corroded or dirty, the calibration resistance is again measured by, for example, opening the cover 120 and In measuring the voltage supplied to ADC 150. At this later point in time, the calibration resistance will correspond to the reference resistance plus some "additional resistance" due to wear on the contacts 140 and 142. By subtracting the calibration resistance measured at the later time from the stored reference resistance, the microprocessor 160 can determine the "additional resistance" that has been added into the circuit as a result of the wear on contacts 140 and 142. During subsequent operation of the ladder matrix, the microprocessor 160 uses this "additional resistance" value to adjust or calibrate the resistance received upon depression of the keypad buttons so as to compensate for changes in temperature or oxidation of the switch contacts. In one embodiment, the microprocessor 160 performs this calibration by first subtracting the "additional resistance" from the measured resistance associated with depression of a keypad button, and once the "additional resistance" has been subtracted from the measured resistance received via the keypad button, the microprocessor 160 then attempts to associated that adjusted resistance with a particular button on the keypad by matching the adjusted resistance value against a look up table.

In one embodiment of the invention the reference voltage is 3.3 V. Although FIG. 1 shows the calibration element 115 as a physical resistor, in the preferred embodiment, the resistance of the calibration element 115 actually corresponds to the equivalent resistance of all the elements of the mobile phone as measured across terminals 140 and 142 with all switches $S_1$, $S_2$ ... $S_N$ open. In this particular embodiment, the equivalent resistance ($R_{CAL}$) of the calibration element is approximately 210KΩ. The values of $R_1$ through $R_N$ in this embodiment were selected to be compatible with the ability of the ADC 150 to discriminate between voltage levels while also keeping the values compatible with the remaining phone circuitry. In one specific embodiment, $R_1$ was 1KΩ, $R_{20}$ ($R_N$) was 261KΩ, and R2 through R19 fell somewhere between those values. It should be understood that other values for $R_1$ through $R_N$ and $R_{CAL}$ (equivalent resistance) could alternatively be used. In addition, it will be understood by those skilled in the art that other circuit elements or arrangements that produce a calibration voltage when connected between a reference voltage and ground could be used in place of the calibration element 115 shown in FIG. 1.

The previous description of the preferred embodiments is provided to enable any person skilled in the art to make or use the present invention. The various modifications to these embodiments will be readily apparent to those skilled in the art, and the generic principles defined herein may be applied to other embodiments without the use of inventive faculty. Thus, the present invention is not intended to be limited to the methods and apparatuses shown herein but is to be accorded the widest scope consistent with the claims set forth below.

What is claimed is:

1. A method for calibrating a resistive ladder switching matrix coupled to a keypad in a portable electronic device having a housing with a cover that may be positioned in an open state or a closed state, comprising the steps of:

coupling a first contact of a calibration element to a reference voltage by moving the cover from the open state to the closed state;

when the first contact of the calibration element is coupled to the reference voltage and a second contact of the calibration element is coupled to ground, determining a calibration resistance across the calibration element; and calibrating signals from the resistive ladder switching network when the cover is in the closed state in accordance with the calibration resistance.

2. The method of claim 1, wherein the calibration element has a resistance that corresponds to an input impedance of the resistive ladder switching matrix when no buttons associated with the keypad are depressed.

3. The method of claim 1, wherein the calibration element includes a resistor.

4. The method of claim 1, wherein the portable electronic device is a mobile telephone.

5. The method of claim 4, wherein the keypad is positioned upon an exterior of the cover such that the keypad is exposed when the cover is in the closed state.

6. The method of claim 1, further comprising the step of decoupling the first contact of the calibration element from the reference voltage by moving the cover from the closed state to the open state.

7. A method for calibrating a resistive ladder switching matrix coupled to a keypad in a portable electronic device having a housing with a cover that may be positioned in an open state or a closed state, comprising the steps of:

coupling a first contact of a calibration element to ground by moving the cover from the open state to the closed state;

when the first contact of the calibration element is coupled to ground and a second contact of the calibration element is coupled to reference voltage, determining a calibration resistance across the calibration element; and calibrating signals from the resistive ladder switching network when the cover is in the closed state in accordance with the calibration resistance.

8. The method of claim 7, wherein the calibration element has a resistance that corresponds to an input impedance of the resistive ladder switching matrix when no buttons associated with the keypad are depressed.

9. The method of claim 7, wherein the calibration element includes a resistor.

10. The method of claim 7, wherein the portable electronic device is a mobile telephone.

11. The method of claim 10, wherein the keypad is positioned upon an exterior of the cover such that the keypad is exposed when the cover is in the closed state.

12. The method of claim 11, further comprising the step of decoupling the first contact of the calibration element from ground by moving the cover from the closed state to the open state.

13. A method for calibrating a resistive ladder switching matrix coupled to a keypad in a portable electronic device having a housing with a cover that may be positioned in an open state or a closed state, comprising the steps of:

coupling a first contact of a calibration element to a reference voltage and a second contact of the calibration element to ground by moving the cover from the open state to the closed state;

when the first contact of the calibration element is coupled to the reference voltage and the second contact of the calibration element is coupled to ground, determining a calibration resistance across the calibration element; and calibrating signals from the resistive ladder switching network when the cover is in the closed state in accordance with the calibration resistance.

14. The method of claim 13, wherein the calibration element has a resistance that corresponds to an input impedance of the resistive ladder switching matrix when no buttons associated with the keypad are depressed.

15. The method of claim 13, wherein the calibration element includes a resistor.

16. The method of claim 13, wherein the portable electronic device is a mobile telephone.

17. The method of claim 16, wherein the keypad is positioned upon an exterior of the cover such that the keypad is exposed when the cover is in the closed state.

18. The method of claim 17, further comprising the step of decoupling the first contact of the calibration element from the reference voltage and the second contact of the calibration element from ground by moving the cover from the closed state to the open state.

19. An apparatus for calibrating a resistive ladder switching matrix coupled to a keypad in a portable electronic device having a housing with a cover that may be positioned in an open state or a closed state, comprising:

a calibration element having a first contact coupled to a reference voltage and a second contact coupled to ground when the cover is in the closed state, wherein the first contact is detached from the reference voltage and the second contact is detached from ground when the cover is in the open state;

a microprocessor that determines a calibration resistance across the calibration element when the cover is in the closed state and calibrates signals from the resistive ladder switching network when the cover is in the closed state in accordance with the calibration resistance.

20. The apparatus of claim 19, wherein the calibration element has a resistance that corresponds to an input impedance of the resistive ladder switching matrix when no buttons associated with the keypad are depressed.

21. The apparatus of claim 19, wherein the calibration element includes a resistor.

22. The apparatus of claim 19, wherein the portable electronic device is a mobile telephone.

23. The apparatus of claim 22, wherein the keypad is positioned upon an exterior of the cover such that the keypad is exposed when the cover is in the closed state.

24. The apparatus of claim 19, wherein the first contact of the calibration element is decoupleable from the reference voltage and the second contact of the calibration element is decoupleable from ground by moving the cover from the closed state to the open state.

* * * * *